United States Patent [19]
Larson et al.

[11] 4,002,923
[45] Jan. 11, 1977

[54] TOUCH ACTUATED ELECTRONIC SWITCH

[75] Inventors: Willis A. Larson, Mequon, Wis.; David E. Colglazier, Minneapolis, Minn.

[73] Assignee: Magic Dot, Inc., Minneapolis, Minn.

[22] Filed: Aug. 26, 1974

[21] Appl. No.: 500,501

Related U.S. Application Data
[63] Continuation of Ser. No. 284,043, Aug. 28, 1972.

[52] U.S. Cl. .......................... 307/116; 200/DIG. 1
[51] Int. Cl.² ........................ H01H 35/00
[58] Field of Search .............. 307/116; 340/365 C, 340/258 C; 328/5; 200/DIG. 1; 317/DIG. 2, 146

[56] References Cited
UNITED STATES PATENTS

| | | | |
|---|---|---|---|
| 2,896,131 | 7/1959 | Schumann | 200/DIG. 1 X |
| 3,275,897 | 9/1966 | Atkins | 200/DIG. 1 X |
| 3,281,541 | 10/1966 | Learner | 200/DIG. 1 X |
| 3,320,438 | 5/1967 | Myers | 200/DIG. 1 X |
| 3,492,440 | 1/1970 | Cerbone et al. | 200/DIG. 1 X |
| 3,869,671 | 3/1975 | Schroder | 340/258 C X |

OTHER PUBLICATIONS

Williams, IBM Tech. Disc. Bull. June 1974, vol. 17 No. 1, pp. 166–167.

*Primary Examiner*—Robert K. Schaefer
*Assistant Examiner*—W. E. Duncanson, Jr.
*Attorney, Agent, or Firm*—John Phillip Ryan

[57] ABSTRACT

An electronic switch which has no moving parts and is actuated by the capacitance of an operator providing a connection between earth ground and an input to the electronics associated with the switch is disclosed. The electronic switch in the preferred embodiment, includes a plate accessible to the tough of a human operator electrically connected to a first amplifier, and particularly to the input which is isolated from and thus oscillating with respect to earth ground. The output of the first amplifier is simultaneously connected to one end of a storage capacitor, having its other end connected to earth ground, and to one end of a high impedance. A second amplifier, is connected to the other end of the high impedance to provide a switched output, with the switched output having a first state for approximating an electrical short circuit and a second state for approximating an electrical open circuit.

23 Claims, 4 Drawing Figures

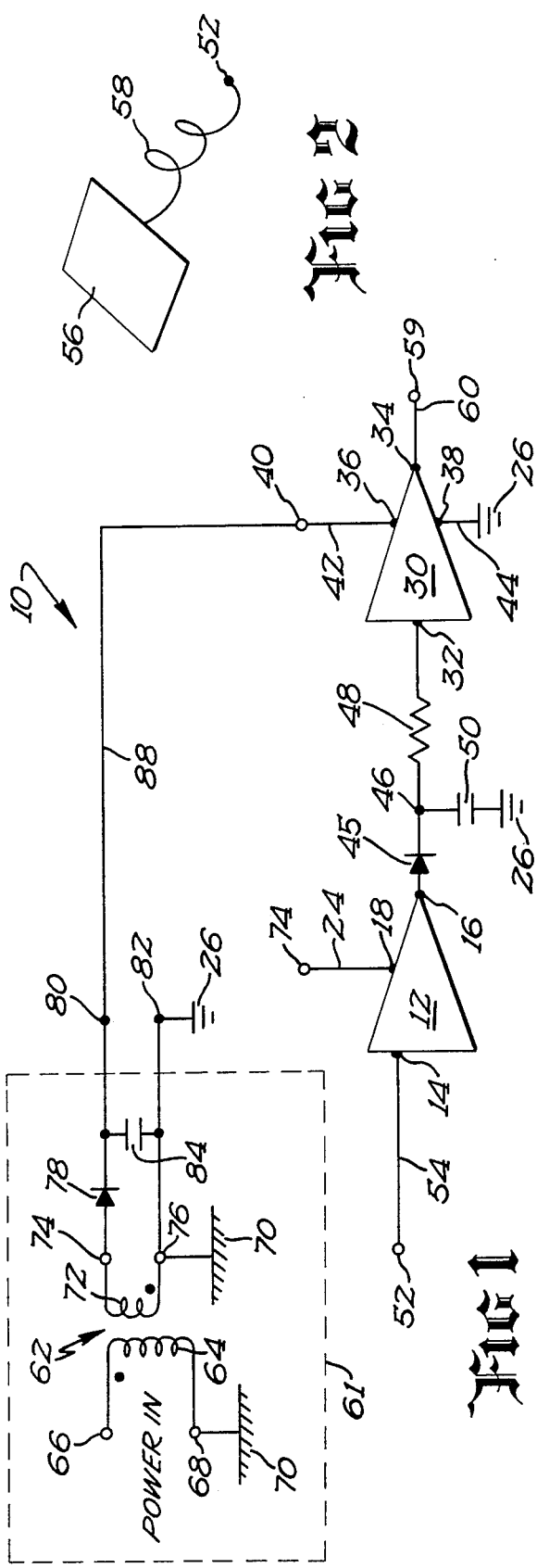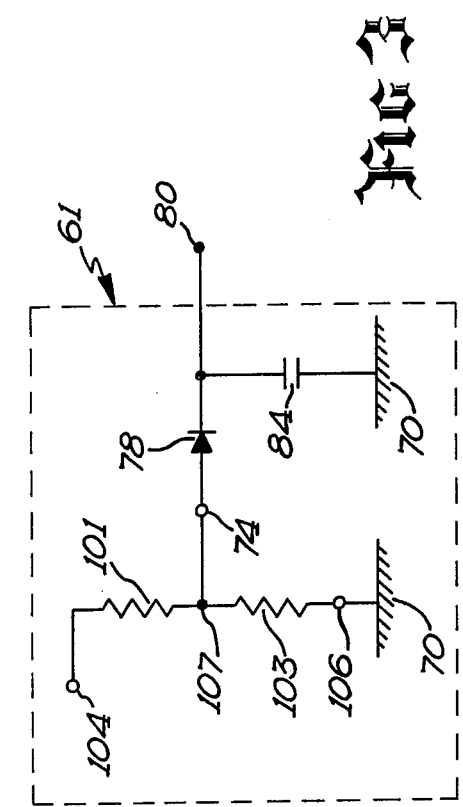

TOUCH ACTUATED ELECTRONIC SWITCH

BACKGROUND

This is a continuation of application Ser. No. 284,043 filed Aug. 28, 1972.

This invention relates generally to electronic switching and more specifically to a touch actuated electronic switch which has no moving parts and is actuated by the capacitance of an operator providing a connection between an oscillating input to the electronics associated with the switch and earth ground.

In the past various approaches have been suggested to provide switches actuated by the capacitance of a human touching or approaching a portion of the electronics of the switch. Past approaches have suffered from certain drawbacks, however, including relatively high input currents which can be dangerous to humans, low noise suppression or immunity, high cost, large size, difficult fabrication, unreliable actuation once touched or approached, premature actuation before touched or approached, and a general questionable or poor reliability of performance.

SUMMARY

The present invention provides an electronic switch which solves these and other problems by providing, in the preferred embodiment, an electronic switch including a series connection of a touch plate and first amplifier, isolated from earth ground, and high impedance and second amplifier, all electrically connected to earth ground. A storage device, in the preferred embodiment shown as a capacitor, is connected between the junction of the first amplifier and the high impedance and extends to the reference point of the switching circuit. The arrangement of the switching circuit is such that an input to the first amplifier is provided by operator's touch of the touch plate, the input is amplified and rectified in the first amplifier, the output of the first amplifier charges the capacitor, and the charge of the capacitor is conducted through the high impedance into the second amplifier where it controls the output of the second amplifier between a first state for approximating an electrical short circuit and a second state for approximating an electrical open circuit.

It is thus an object of the present invention to provide a novel touch actuated electronic switch.

It is a further object of the present invention to provide such a switch where the electronics associated with the switch may be used in applications requiring a connection to earth ground.

It is a further object of the present invention to provide such a switch which is capable of operating on input currents below a level dangerous to humans.

It is a further object of the present invention to provide such a switch which is inexpensive to fabricate and of a small size.

It is a further object of the present invention to provide such a switch which is reliable.

It is a further object of the present invention to provide such a switch with high noise immunity.

It is a further object of the present invention to provide such a switch which is easily fabricated.

These and further objects and advantages of the present invention will become clearer in the light of the following detailed description of the illustrative embodiments of this invention described in connection with the drawings.

DESCRIPTION OF THE DRAWINGS

FIG. 1 shows a schematic diagram of electronics which can be used with the electronic switch of the present invention.

FIG. 2 shows a touch plate for use with the electronic switch of the present invention.

FIG. 3 shows one alternate embodiment of power supply which may be used with the circuitry of FIG. 1.

DESCRIPTION

Figure 4:
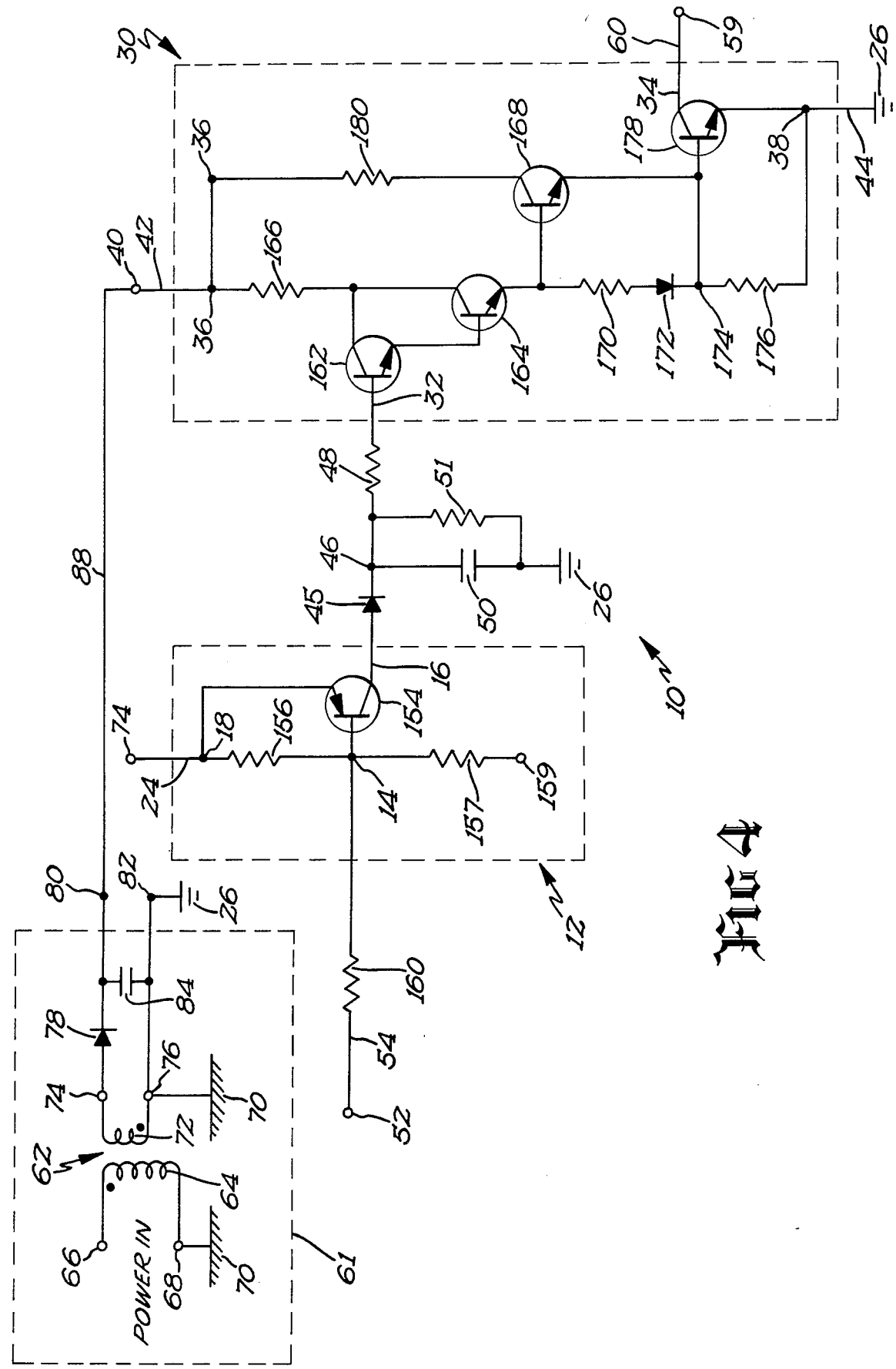
FIG. 4 shows a more detailed schematic of electronics which can be used with the electronic switch of the present invention shown in connection with a power supply operating from an alternating voltage input and also showing arrangements and configurations allowing enhancement of the reliability and increasing the noise immunity or noise suppression of the switch.

In FIG. 1, the electronic switching circuitry of the switch of the present invention is generally designated 10. This electronic circuitry includes an amplifier 12, including a signal input 14, a signal output 16, and an alternating power input 18.

The electronic circuitry further includes a second amplifier 30 including a signal input 32, a signal output 34, a power input 36, and a reference or circuit ground input 38. Power input 36 is connected to a power terminal 40 by a wire 42 and circuit ground input 38 is connected to circuit ground 26 by a wire 44.

Output 16 of amplifier 12 is connected to the anode of a diode 45 having its cathode connected to junction point 46. Junction point 46 is further connected to input 32 of second amplifier 30 through a high value of impedance or resistance such as resistor 48. Junction point 46 is further connected to circuit ground 26 through a storage integrating, or smoothing element, shown as capacitor 50.

Input 14 to amplifier 12 of the switching circuit 10 is shown as connected to switching circuit input terminal 52 through a connection 54. Switching circuit terminal input 52 is further connected to a touch plate 56, as shown in FIG. 2, by a wire 58. Touch plate 56 is a metal plate or other conductive material which may be an actual plate, spot of a conductive or semiconductive material, or the like.

Signal output 34 of amplifier 30 is connected to output terminal 59 of circuitry 10 by a wire 60. The electrical impedance or resistance between output terminal 59 and circuit ground 26 is then arranged in a manner hereinafter explained to approximate an electrical short circuit in a first state and an electrical open circuit in a second state, the state depending upon whether the operator's finger is touching or not touching touch plate 56.

A power supply for the switching circuit 10 of the present invention is generally designated 61. Power supply 61 of FIG. 1 includes a transformer generally designated 62 having a primary winding 64. Primary winding 64 includes transformer primary winding terminals 66 and 68 shown as connected to a source of alternating frequency power labeled "power in". Transformer 62 further includes a secondary winding 72 which includes secondary winding terminals 74 and 76. Terminals 68 and 76 are shown as connected to earth ground, generally designated 70.

Secondary terminal 74 is connected to alternating power input 18 of amplifier 12 by wire 24 and by a diode 78 to one power supply terminal 80. The other power supply terminal 82 is connected to circuit ground 26 and thus to earth ground 70. A filter capacitor 84 is conventionally connected between power supply terminals 80 and 82.

Power supply terminal 80 is further connected to switching circuit 10 and in particular to power supply terminal 40 of the second amplifier 30 by a wire 88.

FIG. 3 shows one of many alternate embodiments of power supply 61 wherein a series connection of resistors 101 and 103 are connected between one terminal 104 connected to a source of alternating frequency power arranged between terminal 104 and a further terminal 106. Terminal 106 is further connected to earth ground 70. The resistors 101 and 103 are joined together at a junction point 107 which is then directly connected to a terminal 74. Thus, the power supply of FIG. 3 operates in the manner of a voltage divider across the alternating voltage supply. The power supply 61 of FIG. 3 as shown may be used as a substitute for the power supply 61 of FIGS. 1 or 4, or the voltage divider network of FIG. 3, alone, may be used in conjunction with the power supply 61 of FIGS. 1 or 4 such that the voltage divider network provides the alternating power to terminal 74 and D.C. power is provided by power supply 61 as shown in FIGS. 1 or 4, or their equivalent.

The embodiment of FIG. 4 is similar to the embodiment of FIG. 1 with the addition of the electronics disclosed within the dotted lines indicating amplifiers 12 and 30 and power supply 61.

Amplifier 12 includes a PNP transistor 154 having its emitter connected to power input 18 of amplifier 12, its collector connected to signal output 16 of amplifier 12, and its base connected to signal input 14 of amplifier 12. A resistor 156 is then connected between alternating power input 18 and signal input 14 to aid in preventing the leakage current of transistor 154 from rendering transistor 154 conducting.

In FIG. 4, connection 54 is shown to include a high value resistor 160 useful in protecting the human touching touch plate 56 from the alternating voltage of circuitry 10 and further protecting the input of amplifier 12 from damage from excessive currents induced through touch plate 56 such as by a direct connection to a high voltage source or by static electricity from the human operator.

Amplifier 30 includes a Darlington arrangement of NPN transistors 162 and 164 having their common collectors connected to power input 36 of amplifier 30 through a current limiting resistor 166. The base of transistor 162 is connected to signal input 32 of amplifier 30, while the emitter of transistor 164 is connected to the base of a further NPN transistor 168 and to reference input 38 of amplifier 30 through a series connection of resistor 170, diode 172, junction point 174, and resistor 176.

The collector of transistor 168 is also connected to power input 40 through a further current limiting resistor 180, junction point 36, and wire 42.

Junction point 174 is also connected to the emitter of transistor 168 and to the base of transistor 178 which has its collector connected to signal output 59 and its emitter connected to reference input 38.

The resistor 170, diode 172, and resistor 176 series arrangement provides bias to transistors 168 and 178 within amplifier 30. In particular, the series arrangement acts as the emitter resistor of Darlington pair 162 and 164.

Further, resistor 170, diode 172, and resistor 176 aid in preventing leakage currents from rendering transistor 178 conducting.

OPERATION

Basically the electrical switch of the present invention operates as follows: the electrical switching circuitry 10 is coupled, for example by transformer 62, to a source of alternating frequency power for causing the input to amplifier 12 to oscillate with respect to earth ground at the rate of the power input. The capacitance of the operator's finger in touching touch plate 56 then provides a reference between amplifier 12 of circuit 10 and earth ground which appears to amplifier 12 as an alternating frequency power input of an amplitude substantially equal to the amplitude at which the input to amplifier 12 is oscillating with respect to earth ground. With this signal indicating the operator's touch of touch plate 56, circuit 10 provides a switched output, which may be a transition from an open circuit to a closed circuit, or if desired, a transition from a closed circuit to an open circuit. That is, the output of circuitry 10 has the effect of an electrical switch.

In particular, since the emitter of transistor 154 is connected to terminal 74 of secondary 72 of transformer 62, the emitter is oscillating positively and negatively with respect to earth ground 70 in synchronism, but as explained herein, in opposite phase to the power input frequency. Also, because of the interconnection of resistor 156 between the emitter and base of transistor 154, both the emitter and base oscillate substantially together.

Therefore, because of the oscillation of the emitter and base of transistor 154 with respect to earth ground 70, from the frame of reference of circuit input 52 and viewing earth ground 70, an oscillatory voltage appears between the earth ground 70 and circuit input 52. Therefore, it has been found that the operator's touch of plate 56 provides a capacitive coupling between touch plate 56 and thus circuit input 52, and earth ground 70 which causes the oscillatory signal to be applied to circuit input 52.

During the one-half cycle of power input which is positive with respect to earth ground 70, and assuming the application of the operator's finger to input 52, the emitter-base junction of transistor 154 is forward biased to charge the capacitance presented by the operator between input 52 and earth ground. That is, to input 52 the operator presents a capacitance which thus allows an interconnection between the previously isolated input 52 and earth ground. Thus, a current flows from power supply terminal 74 through the emitter base junction of transistor 154, through resistor 160, through input 52, and through the capacitance of the operator to earth ground to thus charge the capacitance of the operator during the positive one-half cycle of the power input.

Therefore, due to this emitter-base current and the gain inherent in a transistor, the collector current of transistor 154 charges capacitor 50.

During the one-half cycle of the power input which is negative with respect to earth ground, and assuming the continued application of the operator's finger to input 52, the emitter-base junction of transistor 154 becomes reverse biased, and the base-collector junction of transistor 154 becomes forward biased.

Since the impedance path from capacitor 50 through the forward biased collector-base junction and through resistor 156 to terminal 74 is a relatively high impedance path, capacitor 50 will not appreciably discharge from this effect.

However, because the emitter-collector junction of a transistor does not have a significant reverse bias breakdown voltage, capacitor 50 can discharge through the collector and emitter junctions of transistor 154 in a reverse bias mode unless diode 45 is inserted to isolate capacitor 50 during this time and prevent capacitor 50 from discharging.

The placement of diode 45 is a further subtlety of the present invention in that it would ordinarily be thought possible to place diode 45 between junction point 18 and junction point 74 of amplifier 12. If diode 45 is so placed, however, it prevents the discharge of the capacitance of the operator through resistors 160 and 156 to terminal 74 and does not allow the switch circuitry of the present invention to operate as will become clearer from the following discussion of the effects as respects the capacitance of the operator.

A further subtlety of the present invention has been referred to above in that, without latching and without an artificial discharge of the voltage of capacitor 50, the capacitance of the operator must be allowed to become discharged during the negative one-half cycle of the power, for the preferred circuitry shown, to thus allow the next positive one-half cycle to again charge the capacitance of the operator and again provide base current which is in turn amplified to provide the charging current for capacitor 50. That is, the discharge path for the capacitance of the operator through resistor 160, resistor 156, and the remainder of power supply 61 must be such as to allow the capacitance of the operator to discharge.

Assuming the worst case capacitance of a human to be 10 picofarads or less, at a 60 hertz power frequency, the capacitive reactance of the human touch is approximately 266 megohms. If it is assumed that the signal input 14 to amplifier 12 is oscillating with respect to earth ground 70 at a voltage of approximately ten volts, it can be seen that a current input to amplifier 12 of FIG. 1 is in the order of 20 nanoamperes at most. Amplification of currents in this order of magnitude is further contra to the thinking of those skilled in the art who are considered to believe currents in this range well into the range of noise currents and thus below the threshold of current which can be usefully amplified.

Thus extremely small 20 nanoampere input current is then amplified and rectified by amplifier 12, designed with a gain at least 10, and used to charge capacitor 50 connected to the output of amplifier 12.

Capacitor 50 is representative of various storage means possible according to the teachings of the present invention and is of a size capable of being easily fabricated by mass production techniques in small size. That is, in the embodiment of FIG. 1 capacitor 50 is on the order of 1000 picofarads which may be currently fabricated by integration or thick film techniques so as to be mass produced in sizes on the order of a few thousands of an inch square.

Capacitor 50, once charged, approximates a current source for the high gain amplifier 30 through the high impedance path provided by the large value resistor 48. In the preferred embodiment of the switch as shown in FIG. 1, the value of resistor 48 is on the order of 10 megohms and the current gain for amplifier 30 is on the order of 10 to the 6th power or 10 to the 7th power. Resistor 48 may also be a voltage controlled resistance such as a field effect transistor, or may be incorporated within the input impedance of amplifier 30, such as a field effect transistor first stage.

The high value of resistor 48 is to assure that, along with sufficient gain in amplifiers 12 and 30, capacitor 50 is not sufficiently discharged as to allow ripple to appear at that switch output 59. That is, with the parameters given above, the placement of the operator's finger upon the touch plate 56 allows a rapid charging of capacitor 50 with the effect of changing the state of amplifier 30. If the gain of amplifier 12 is not sufficient to maintain capacitor 50 in a charged state, or if the value of resistor 48 with respect to the power frequency is not sufficiently large, or if the gain of amplifier 30 is not sufficient, the output impedance at output 59 may vary from the desired open circuit or closed circuit to an intermediate value which is not acceptable. That is, assuming the finger of an operator touching touch plate 56 renders the output impedance at output terminal 59 a short circuit, i.e. transistor 178 of FIG. 4 saturated, insufficient gain in amplifiers 12 or 30 or insufficient impedance in resistor 48 would allow the impedance from output terminal 59 to circuit ground 26 to rise from substantially zero ohms, i.e. transistor 178 in conducting but unsaturated state, and constitute impedance which must be accounted for.

Now that the basic operation of the electronic switch of the present invention has been explained, the selection of the various parameters for proper operation can be appreciated. In the preferred embodiment, the first parameter selected is the value of the storage means 50, in this case the capacitance. As set out above, the value of the capacitance is selected for its ease of fabrication by mass production techniques.

Next, the operating supply voltages, i.e. the voltage, E, between supply terminals 80 and 82, is chosen.

Next, the output current requirements of the switch are selected. That is, the current to be flowing at output terminal 59 and thus to be switched by the electronic switch of the present invention should be known within specific ranges.

Next, the gain for amplifier 30 may be calculated by multiplying the output current by the period of the alternating frequency power and dividing by the product of the supply voltage multiplied by the value of capacitor 50. That is, the expression may be set out as follows:

$$\text{Gain [Amplifier 30]} = I\, T/E\, C_{50}$$

Gains of between 10 to the seventh power and 10 to the second power have been used for T equal to 20 milliseconds, I equal to 150 milliamperes, E equal to 5 volts, and $C_{50}$ equal to 1000 picofarads.

Next, the value of resistance 48 may be calculated by dividing the time period of the alternating frequency power by the value of capacitor 50. This value, assuming sufficient gain in an amplifier 12, will prevent or avoid the complete discharge of capacitor 50.

Next, the gain of amplifier 12 is selected to assure that the 20 nanoampere input will charge capacitor 50 within the period of the alternating frequency power to thus provide a rapid turnon of the switch. The current output required for amplifier 12 is approximately the product of the supply voltage multiplied by the value of capacitor 50 and divided by the period of the alternating frequency power. That is, the expression is:

Io[Amplifier 12] = E C$_{50}$/T

Gains of between 10 and 100 have been used for E equal to 5 volts, C$_{50}$ equal to 1000 picofarads, and T equal to 20 milliseconds.

It has been found that if the gain of amplifier 12 is reduced and the gain of amplifier 30 is increased correspondingly, the circuit will also operate satisfactorily. Also, the converse has been found to apply. Thus, the gains of amplifier 12 between 10 and 10 to the third power have been found to correspond to gains of amplifier 30 of between 10 to the seventh power and 10 to the second power.

A subtle feature of the present invention may now be explained. The phasing of the alternating frequency power input with respect to the oscillation of circuit ground 26 must be considered under the following conditions. Assuming an induced voltage on the operator from the source of alternating frequency power, if the induced voltage is approximately equal in amplitude to the oscillatory amplitude of input 52, no signal is induced between circuit input 52 and earth ground 70. That is, the operator is oscillating simultaneously with amplifier 12, and no input signal is provided. This subtle defect can be used to advantage, as seen in FIG. 1. It is to be noted that transformer 62 is arranged such that the alternating frequency voltage appearing across secondary terminals 74 and 76 is 180° out of phase from the alternating frequency voltage appearing between primary terminals 66 and 68. This is to be seen from the dot convention applied to transformer 62. Thus, by this technique, the oscillations of amplifier 12 with respect to earth ground 70 may be such as to cause amplifier 12 to oscillate with respect to earth ground at the rate of the alternating frequency power in the opposite phase to that of the source of alternating frequency power to provide a more reliable switching by effectively doubling the signal input amplitude at terminal 52, assuming the same induced voltage upon the operator.

It has also been found that with the inclusion of resistor 51 in parallel with capacitor 50 that the discharge of voltage across capacitor 50, and thus the turn off time of the circuit, can be greatly improved. Resistor 51 is on the order of 50 megohms and thus does not substantially discharge capacitor 50 in the active mode of the switching circuitry 10.

Further, it has been found that with the inclusion of resistor 51 that fewer problems are presented from transients, heat, and transistor leakage currents and a generally improved noise suppression or noise immunity is achieved.

It can now be appreciated by those skilled in the art that the protective measures included in the copending application for Letters Patent, entitled "Apparatus And Material For Protecting Microelectronics From High Potential Electricity", Ser. No. 280,258, filed on or about Aug. 14, 1972, in the names of Willis A. Larson and David E. Colglazier, now U.S. Pat. No. 3,887,848, may also be used in connection with the microelectronics of the present invention.

Thus, a touch actuated electronic switch has been provided which can be easily integrated or adapted to other mass production techniques in that it includes no large capacitors, inductors, or other parts preventing such mass production. Further, the switch of the present invention requires no standby power as in other types of touch actuated switches.

Thus, since the invention disclosed herein may be embodied in other specific forms without departing from the spirit or general characteristics thereof, some of which forms have been indicated, the embodiments described herein are to be considered in all respects illustrative and not restrictive. The scope of the invention is indicated by the appended claims rather than by the foregoing description, and all changes which come within the meaning and range of equivalency of the claims are intended to be embraced therein.

What is claimed is:

1. A switching circuit actuated by the touch of a human, comprising in combination: means for supplying alternating voltage power to the switching circuit including a first output for providing a reference coupled to earth ground and including a second output for providing a source of alternating voltage; first amplification means having input means for receiving a signal to be amplified and having output means; second amplification means having input means for receiving a signal to be amplified and having output means for providing a switched output, with the switched output having a first state for approximating an electrical short circuit and a second state for approximating an electrical open circuit; storage means; a touch plate isolated from earth ground; first means for providing an electrical connection between the first amplification means and the second output of the means for supplying power to the switching circuit; second means for providing an electrical connection between the output means of the first amplification means and the storage means; third means for providing an electrical connection between the storage means and the input to the second amplification means; fourth means for providing an electrical connection between the input means of the first amplification means and the touch plate to allow the capacitance of the human to provide an earth reference to the first amplification means and cause the output of the second amplification means to change between the first and second states.

2. The switching circuit of claim 1, wherein the storage means comprises a capacitor.

3. The switching circuit of claim 2, wherein the storage means further includes a resistor of high value in parallel with the capacitor.

4. The switching circuit of claim 1, wherein the second connection means comprises unidirectional means.

5. The switching circuit of claim 4, wherein the unidirectional means comprises a diode.

6. A switching circuit actuated by the touch of a human, comprising in combination: means for supplying alternating voltage power to the switching circuit including a first output for providing a reference coupled to earth ground and including a second output for providing a source of alternating voltage; amplification means having input means for receiving a signal to be amplified and having output means; storage means; a touch plate isolated from earth ground; first means for providing an electrical connection between the amplification means and the second output of the means for supplying power to the switching circuit; second means for providing an electrical connection between the output means of the amplification means and the storage means; and third means for providing an electrical connection between the touch plate and the input means of the amplification means.

7. The switching circuit of claim 6 wherein the second connection means comprises unidirectional means.

8. The switching circuit of claim 7, wherein the unidirectional means comprises a diode.

9. Switching circuitry actuated by a human, comprising in combination: a surface isolated from earth ground and accessible to an operator in a manner to allow electronic signal coupling between the surface and the operator; means for providing an oscillation, including a first output for providing a reference coupled to earth ground and including a second output for providing a source of oscillation; amplifier means including power input means, signal input means, and signal output means; integrating means having a first terminal coupled to earth ground and a second terminal; means for providing an electrical connection between the surface and the amplifier signal input means; means for providing an electrical connection between the second terminal of the integrating means and the amplifier signal output means; means for providing an electrical connection between the second output of the oscillation means and the amplifier means.

10. Switching circuitry of claim 9, wherein the means for providing an electrical connection between the second terminal of the integrating means and the amplifier signal output means comprises unidirectional means.

11. The switching circuitry of claim 10, wherein the unidirectional means comprises a diode.

12. The switching circuitry of claim 11, wherein the means for providing an electrical connection between the second output of the oscillation means and the amplifier means comprises an electrical connection to the power input means of the amplifier means.

13. The switching circuitry of claim 12, wherein the means for providing the oscillation comprises power supply means for accepting an alternating frequency power input and for providing a direct current power output and wherein the means for providing an electrical connection between the second output of the oscillation means and the amplifier means comprises an interconnection between an oscillatory portion of the power supply and the power input means of the amplifier means.

14. The switching circuitry of claim 13, wherein the integrating means comprises a capacitor.

15. The switching circuitry of claim 14, further including a second amplifier means including signal input means and signal output means and means for providing an electrical connection between the second terminal of the integrating means and the signal input means of the second amplifier means.

16. The switching circuitry of claim 9, wherein the means for providing an electrical connection between the second output of the oscillation means and the amplifier means comprises an electrical connection to the power input means of the amplifier means.

17. The switching circuitry of claim 16 wherein the means for providing the oscillation comprises power supply means for accepting an alternating frequency power input and for providing a direct current power output and wherein the means for providing an electrical connection between the second output of the oscillation means and the amplifier means comprises an interconnection between an oscillatory portion of the power supply and the power input means of the amplifier means.

18. Switching circuitry of claim 16, wherein the means for providing an electrical connection between the second terminal of the integrating means and the amplifier signal output means comprises unidirectional means.

19. The switching circuitry of claim 18, wherein the unidirectional means comprises a diode.

20. The switching circuitry of claim 18, wherein the integrating means comprises a capacitor.

21. The switching circuitry of claim 18, further including second amplifier means including signal input means and signal output means and means for providing an electrical connection between the second terminal of the integrating means and the signal input means of the second amplifier means.

22. The switching circuitry of claim 9, wherein the integrating means comprises a capacitor.

23. The switching circuitry of claim 9, further including second amplifier means including signal input means and signal output means and means for providing an electrical connection between the second terminal of the integrating means and the signal input means of the second amplifier means.

* * * * *